(12) United States Patent
Matsuura et al.

(10) Patent No.: US 9,786,404 B2
(45) Date of Patent: *Oct. 10, 2017

(54) METAL FOIL AND ELECTRONIC DEVICE

(71) Applicant: Mitsui Mining & Smelting Co., Ltd., Tokyo (JP)

(72) Inventors: Yoshinori Matsuura, Ageo (JP); Nozomu Kitajima, Ageo (JP); Toshimi Nakamura, Ageo (JP); Masaharu Myoi, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 174 days.

This patent is subject to a terminal disclaimer.

(21) Appl. No.: 14/408,709

(22) PCT Filed: Apr. 24, 2013

(86) PCT No.: PCT/JP2013/062016
§ 371 (c)(1),
(2) Date: Dec. 17, 2014

(87) PCT Pub. No.: WO2014/017135
PCT Pub. Date: Jan. 30, 2014

(65) Prior Publication Data
US 2015/0194232 A1    Jul. 9, 2015

(30) Foreign Application Priority Data

Jul. 27, 2012  (JP) .................................. 2012-167606

(51) Int. Cl.
*H01L 33/00*   (2010.01)
*H01B 1/02*    (2006.01)
(Continued)

(52) U.S. Cl.
CPC ............... *H01B 1/026* (2013.01); *C23F 3/04* (2013.01); *C23G 1/20* (2013.01); *H01L 51/441* (2013.01);
(Continued)

(58) Field of Classification Search
CPC ............... H01L 51/5203; H01L 51/441; H01L 51/5218; H01L 51/5221; H01L 33/405;
(Continued)

(56) References Cited

U.S. PATENT DOCUMENTS 6,435,014 B1 * 8/2002 Palmquist .............. G01B 21/30
                                                73/104
9,029,885 B2 * 5/2015 Matsuura ........................ 257/95
(Continued)

FOREIGN PATENT DOCUMENTS

JP    2005-216705 A1    8/2005
JP    2007-234254 A1    9/2007
(Continued)

OTHER PUBLICATIONS

European Search Report, European Application No. 13822106.4, dated Mar. 11, 2016 (9 pages).
(Continued)

*Primary Examiner* — Khiem D Nguyen
(74) *Attorney, Agent, or Firm* — Burr & Brown, PLLC

(57) ABSTRACT

There is provided a metal foil suitable for an electrode substrate for an electronic element, which makes it possible to suppress oxidation of the ultra-smooth surface and also prevent roll scratches when wound in a roll. The metal foil of the present invention is made of copper or copper alloy. The front surface of the metal foil has an ultra-smooth surface profile having an arithmetic mean roughness Ra of 30 nm or less as determined in accordance with JIS B 0601-2001. The back surface of the metal has a concave-
(Continued)

dominant surface profile having a Pv/Pp ratio of 1.5 or more, the Pv/Pp ratio being a ratio of a maximum profile valley depth Pv to a maximum profile peak height Pp of a profile curve as determined in a rectangular area of 181 μm by 136 μm in accordance with JIS B 0601-2001.

13 Claims, 9 Drawing Sheets

(51) Int. Cl.
*H01L 51/44* (2006.01)
*H01L 51/52* (2006.01)
*C23F 3/04* (2006.01)
*C23G 1/20* (2006.01)

(52) U.S. Cl.
CPC ...... *H01L 51/5218* (2013.01); *H01L 51/5231* (2013.01); *H01L 2251/5315* (2013.01); *H01L 2251/5338* (2013.01); *Y02E 10/549* (2013.01); *Y10T 428/12993* (2015.01)

(58) Field of Classification Search
CPC   H01L 51/5271; H01L 31/056; H01L 51/5268
See application file for complete search history.

(56) References Cited

U.S. PATENT DOCUMENTS

| | | | |
|---|---|---|---|
| 2001/0014410 A1* | 8/2001 | Mitsuhashi | ............ C23C 28/00 |
| | | | 428/607 |
| 2002/0056842 A1 | 5/2002 | Yamazaki | |
| 2013/0048976 A1 | 2/2013 | Matsuura et al. | |
| 2013/0069042 A1* | 3/2013 | Matsuura | ............ H01L 51/5218 |
| | | | 257/40 |

FOREIGN PATENT DOCUMENTS

| | | | |
|---|---|---|---|
| JP | 2008-243772 A1 | 10/2008 |
| JP | 2009-152113 A1 | 7/2009 |
| JP | 2011-222819 A1 | 11/2011 |
| WO | 2011/111629 A1 | 9/2011 |
| WO | 2011/152091 A1 | 12/2011 |
| WO | 2011/152092 A1 | 12/2011 |

OTHER PUBLICATIONS

Lim, S.F., et al. "Correlation between dark spot growth and pinhole size in organic light-emitting diodes," *Applied Physics Letters*, vol. 78, No. 15, Apr. 9, 2001 (3 pages).

International Search Report and Written Opinion (PCT/JP2013/062016) dated Jul. 30, 2013 (with English translation).

International Preliminary Report on Patentability (PCT/JP2013/062016) dated Feb. 5, 2015 (with English translation).

* cited by examiner

METAL FOIL AND ELECTRONIC DEVICE

CROSS-REFERENCE TO RELATED APPLICATION

This application claims priority to Japanese Patent Application No. 2012-167606 filed on Jul. 27, 2012, the entire disclosure of which is incorporated herein by reference.

BACKGROUND OF THE INVENTION

1. Field of the Invention

The present invention relates to a metal foil and an electronic device including the metal foil.

2. Description of Related Art

Light-emitting elements such as organic EL lighting devices have recently attracted attention as eco-friendly green devices. The organic EL lighting devices are characterized by 1) lower power consumption than incandescent lamps; 2) thin profile and light weight; and 3) flexibility. The organic EL lighting devices are now being developed to achieve the features 2) and 3). In this respect, glass substrates conventionally used in flat panel displays (FPD) or the like cannot achieve the features 2) and 3).

In this regard, researches have been conducted on a substrate as a support (hereinafter, referred to as "supporting substrate") for organic EL lighting devices, and ultra-thin glass plates, resin films, metal foils or the like have been proposed as candidate supporting substrates. The ultra-thin glass is superior in heat resistance, barrier performance, and optical transparency and has good flexibility, but is somewhat inferior in handleability and has low thermal conductivity and high material cost. The resin film is superior in handleability and flexibility and has low material cost and good optical transparency, but is inferior in heat resistance and barrier performance and has low thermal conductivity.

In contrast, the metal foil has excellent characteristics such as superior heat resistance, barrier performance, handleability, and thermal conductivity, good flexibility, and low material cost, except for absence of optical transparency. In particular, a typical flexible glass or film has a significantly low thermal conductivity of 1 W/m° C. or lower, while a copper foil has a significantly high thermal conductivity of about 400 W/m° C.

PTL 1 (JP2009-152113A) discloses formation of an organic layer on a surface of a metal substrate that is smoothed by polishing and/or plating in order to achieve a light-emitting element including the metal substrate. PTL 2 (JP2008-243772A) discloses formation of an organic EL element on a smooth surface of a nickel plating layer that is formed on a metal substrate without polishing or the like. Aside from these disclosures, a photoelectric element including a metal substrate is proposed; for example, PTL 3 (JP2011-222819A) discloses a solar cell with a thin organic electromotive layer provided on a smoothed metal substrate. In these techniques, however, the smoothing of the metal substrate is an important challenge for prevention of a short circuit between the electrodes. For addressing this challenge, PTL 4 (WO2011/152091) and PTL 5 (WO2011/152092) disclose metal foil having an ultra-smooth surface having an extremely low arithmetic mean roughness Ra of 10.0 nm or less that functions as both supporting substrates and electrodes.

Copper foil readily rusts, so that surface treatments such as organic anti-rust treatments, inorganic anti-rust treatments, and coupling treatments have been conducted. An organic rust inhibitor or the like present on a copper foil used for an electrode substrate, however, may cause adverse effects on the device characteristics or the like. If no anti-rust treatment is employed, the oxidation of the surface will proceed and may cause problems such as peeling of the reflective film and an increase in the electrical resistance of the device. Specifically, the copper foil wound in a roll for a roll-to-roll process is significantly oxidized. Such oxidation raises some problems especially in mass production of the electrode substrates for electronic devices. Furthermore, the surface of copper foil wound in a roll readily undergoes roll scratches.

CITATION LIST

Patent Literature

PTL 1: JP2009-152113A
PTL 2: JP2008-243772A
PTL 3: JP2011-222819A
PTL 4: WO2011/152091
PTL 5: WO2011/152092

SUMMARY OF THE INVENTION

The inventors have currently found that by providing a front surface of a metal foil with an ultra-smooth profile for forming an electronic element and providing a back surface with a concave-dominant profile, it is possible to suppress oxidation of the ultra-smooth surface and also prevent roll scratches when wound in a roll.

Accordingly, it is an object of the present invention to provide a metal foil suitable for an electrode substrate for forming an electronic element, which makes it possible to suppress oxidation of the ultra-smooth surface and also prevent roll scratches when wound in a roll.

According to an aspect of the present invention, there is provided a metal foil comprising copper or copper alloy, the metal foil having a front surface and a back surface, wherein the front surface has an ultra-smooth surface profile having an arithmetic mean roughness Ra of 30 nm or less as determined in accordance with JIS B 0601-2001, and the back surface has a concave-dominant surface profile having a Pv/Pp ratio of 1.5 or more, the Pv/Pp ratio being a ratio of a maximum profile valley depth Pv to a maximum profile peak height Pp of a profile curve as determined in a rectangular area of 181 μm by 136 μm in accordance with JIS B 0601-2001.

According to another aspect of the present invention, there is provided a metal foil comprising copper or copper alloy, the metal foil having a front surface and a back surface, wherein the front surface has an ultra-smooth surface profile having an arithmetic mean roughness Ra of 30 nm or less as determined in accordance with JIS B 0601-2001, and the back surface has a concave-dominant surface profile having a Pv/Pp ratio of 1.10 or more, the Pv/Pp ratio being a ratio of a maximum profile valley depth Pv to a maximum profile peak height Pp of a profile curve as determined in a rectangular area of 181 μm by 136 μm in accordance with JIS B 0601-2001.

According to another aspect of the present invention, there is provided an electronic device comprising a metal foil and a semiconductor functional layer having semiconductor characteristics provided on an ultra-smooth surface of the metal foil.

DETAILED DESCRIPTION OF THE INVENTION

Metal Foil

Figure 1:
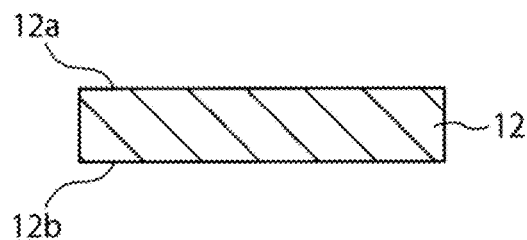
FIG. 1 is a schematic cross-sectional view illustrating a metal foil of the present invention.

FIG. 1 shows a schematic cross-sectional view of a metal foil of the present invention. The metal foil 12 depicted in FIG. 1 is made of copper or copper alloy. Copper foil or copper alloy foil is relatively inexpensive and excellent in strength, flexibility, electrical properties and the like. The metal foil 12 has a front surface 12a and a back surface 12b. The front surface 12a of the metal foil has an ultra-smooth surface profile having an arithmetic mean roughness Ra of 30 nm or less as determined in accordance with JIS B 0601-2001, while the back surface 12b of the metal foil has a concave-dominant surface profile having a Pv/Pp ratio higher than the predetermined value, the Pv/Pp ratio being a ratio of a maximum profile valley depth Pv to a maximum profile peak height Pp of a profile curve as determined in a rectangular area of 181 μm by 136 μm in accordance with JIS B 0601-2001. The arithmetic mean roughness Ra is an indicator of the surface roughness. The surface having an arithmetic mean roughness Ra of 30 nm or less indicates an ultra-smooth surface suitable for the formation of the electronic elements or devices. The maximum profile peak height Pp represents the height of the highest convex, while the maximum profile valley depth Pv represents the depth of the lowest concave. Accordingly, a Pv/Pp ratio higher than the predetermined value represents a specific surface profile which comprises the concave portions dominant to the convex portions.

Thus, by providing the front surface 12a of the metal foil with an ultra-smooth profile for forming an electronic element and providing the back surface 12b with a concave-dominant profile, it is possible to unexpectedly suppress oxidation of the ultra-smooth surface and also prevent roll scratches when wound in a roll. Specifically, the metal foil of the present invention is suitable for an electrode substrate used for electronic devices in that it is possible to suppress oxidation of the ultra-smooth surface for the formation of the elements without using organic rust inhibitors that may cause adverse effects on the device characteristics or the like. The mechanism of the oxidation inhibition effect is not clear in detail, but presumably involves several factors as follows. First, it is believed that the ultra-smooth metal surface having a Ra of 30 nm or less in concert with a uniform dense ultra-thin oxide film (e.g., several nm in thickness) on the metal surface inhibits further oxidation. The inhibited oxidation state can be confirmed through analysis of the surface of the metal foil with an X-ray photoelectron spectroscopic (XPS) system, which can acquire the information on a depth less than 10 nm from the surface. Consequently, a peak due to unoxidized metal copper within the measurable depth is detected in the case where only an ultra-thin oxide film of less than the measurable depth is formed on the surface of the metal foil. Second, it is believed that the inhibited oxidation as described above can reduce the frequency and intensity of contact of unoxidized copper with the oxides in a rolled state of the foil when the front and the back surfaces come into contact with each other, resulting in inhibition of further growth of the oxides. This is because the contact of the metal with the oxides can enhance the oxidation of the original unoxidized metal portions by exposing them to an oxidizing environment. Third, it is presumed that air is less likely to enter a gap between the front and the back surfaces due to the specific profiles of the ultra-smooth surface and the concave-dominant surface, thereby enhancing the oxidation inhibition effect. In any case, the oxidation inhibition effect achieved by the double-side treated metal foil of the present invention has been unexpected, and can eliminate conventional anti-rust treatments, such as application of organic rust inhibitors, which may cause adverse effects on the device characteristics or the like, from the surface of the foil. Furthermore, the controlled surface profiles of the both surfaces (especially the back surface which tend to have a high roughness) can reduce roll scratches when wound in a roll.

The front surface 12a of the metal foil is an ultra-smooth surface having an arithmetic mean roughness Ra of 30 nm or less, preferably 20.0 nm or less, more preferably 10.0 nm or less, still more preferably 7.0 nm or less, determined in accordance with JIS B 0601-2001 and the appropriate roughness can be determined according to the applications, characteristics, or the like required for the metal foil. The arithmetic mean roughness Ra may have any lower limit; it may be 0 (zero), or 0.5 nm in view of the efficiency of surface smoothing treatment. The arithmetic mean roughness Ra can be determined in accordance with JIS B 0601-2001 with a commercially available surface roughness meter.

In addition to the oxidation inhibition effect as described above, the significantly small arithmetic mean roughness Ra of the ultra-smooth front surface 12a of the metal foil as described above can further effectively prevent short circuit between the electrodes when used for an electronic device such as a light-emitting element and a photo-electric element. Such an ultra-smooth surface can be achieved by polishing the metal foil by chemical mechanical polishing (CMP) treatment. CMP treatment can be performed with a known polishing solution and a known polishing pad under known conditions. A preferred polishing solution comprises one or more granular polishing agents selected from ceria, silica, alumina, zirconia, and the like in an amount of from about 0.1% to about 10% by weight; a rust inhibitor such as benzotriazole (BTA); and/or an organic complex forming agent such as quinaldic acid, quinolinic acid, nicotinic acid, malic acid, amino acids, citric acid, carboxylic acid, or poly(acrylic acid); a surfactant such as a cationic surfactant or an anionic surfactant; and optionally an anticorrosive agent. A preferred polishing pad is composed of polyurethane. Adequately regulated polishing conditions such as pad rotational rate, work load, and coating flow of polishing solution can be adopted without particular limitations. It is preferred that the rotational rate be controlled within the range of from 20 rpm to 1,000 rpm, that the work load be controlled within the range of from 100 gf/cm$^2$ to 500 gf/cm$^2$, and that a coating flow of the polishing solution be controlled within the range of from 20 cc/min to 200 cc/min.

The ultra-smooth surface 12a can be formed by polishing metal foil 12 by electrolytic polishing, buff polishing, chemical polishing, a combination thereof, or the like. The chemical polishing can be carried out without particular limitation under appropriately controlled conditions, for example, the type of a chemical polishing solution, the temperature of the chemical polishing solution, the dipping time in the chemical polishing solution. For example, a mixture of 2-aminoethanol and ammonium chloride can be used for chemical polishing of copper foil. The temperature of the chemical polishing solution is preferably room temperature, and a dipping method (Dip process) is preferably used. Furthermore, the preferred dipping time in the chemical polishing solution ranges from 10 to 120 seconds, more preferably from 30 to 90 seconds since long dipping time often results in loss of the smoothness. The metal foil after chemical polishing is preferred to be washed with running water. Such smoothing treatment can smooth the surface from an original arithmetic mean roughness Ra of about 12 nm to a final roughness of 10.0 nm or less, for example, about 3.0 nm.

The ultra-smooth surface 12a may also be achieved by polishing the surface of the metal foil 12 by blasting; or melting the surface of the metal foil 12 by a technique such as laser, resistance heating, or lamp heating followed by rapid-quenching.

Preferably the back surface 12b of the metal foil has a concave-dominant surface profile having a Pv/Pp ratio of 1.5 or more, more preferably 2.0 or more, still more preferably 3.0 or more, especially more preferably 4.0 or more, and the most preferably 5.0 or more, the Pv/Pp ratio being a ratio of a maximum profile valley depth Pv to a maximum profile peak height Pp of a profile curve as determined in a rectangular area of 181 μm by 136 μm in accordance with JIS B 0601-2001. The Pv/Pp ratio is not particularly limited because the Pv/Pp ratio as high as possible is desirable, but the practical upper limit is about 10.0. The maximum profile peak height Pp and the maximum profile valley depth Pv may be determined in accordance with JIS B 0601-2001 with a commercially available non-contact profilometer. The concave-dominant surface 12b of the metal foil has an arithmetic mean roughness Ra of 30 nm or less, preferably 20.0 nm or less, more preferably 10.0 nm or less, most preferably 7.0 nm or less, determined in accordance with JIS B 0601-2001 and the appropriate roughness can be determined according to the applications, characteristics, or the like required for the metal foil. Such an arithmetic mean roughness Ra of 30 nm or less can be provided on the back surface 12b in a similar manner as on the ultra-smooth surface 12a.

For the purpose to decrease dark spots which may be problematic in light-emitting elements such as organic EL devices, if oxidation can be inhibited by other techniques or oxidation resistance may be decreased to some extent, the Pv/Pp ratio of the concave-dominant surface profile may be 1.10 or more, preferably 1.20 or more, more preferably 1.30 or more, and most preferably 1.40 or more. That is, in the case where rather deep scratches, especially gouged scratches (not shallow scratches, but scratches having deeply gouged shape such as those having 0.1 μm or more depth) are present on the front surface 12a of the metal foil, bumps may be formed around the scratches due to the occurrence of the scratches, and may produce so called "dark spots", i.e., the parts of low light emission efficiency, in light-emitting elements such as organic EL devices. In this respect, the back surface (concave-dominant surface) of the foil having a Pv/Pp ratio of 1.10 or more can significantly suppress gouged scratches described above on the front surface of the foil drawn from the roll, and thus can provide a high-performance light-emitting device having significantly reduced dark spots. The concave-dominant surface profile having a Pv/Pp ratio of 1.10 or more can be conveniently achieved by setting the back surface conditions of the metal foil depending on the initial roughness of the back surface to the level such that a gloss appears on the back surface. In this embodiment, Ra of the back surface (concave-dominant surface) of the foil is preferably 80 nm or less, more preferably 70 nm or less, still more preferably 60 nm or less, particularly preferably 50 nm or less, particularly more preferably 40 nm or less, and most preferably 30 nm or less.

Even if the back surface 12b is merely ultra-smoothed similarly to the ultra-smooth surface 12a, the Pv/Pp ratio as described above usually cannot be achieved since concave portions and convex portions are generally formed to a similar extent. Accordingly, it is preferred that the process for providing the back surface 12b with a Pv/Pp ratio as described above be carried out. Preferable examples of the surface treatment include an ultrasonic cleaning, a chemical polishing using a chemical polishing liquid and/or a dry-ice blasting method. The ultrasonic cleaning may be performed, for example, using a commercially available running water-type ultrasonic cleaner, by treating the metal foil surface with a predetermined high frequency output (e.g., 60 W) for a predetermined time (e.g., 10 minutes). The chemical polishing may be performed, for example, using a chemical polishing solution (e.g., a polishing solution for pure copper such as CPB-10, manufactured by MITSUBISHI GAS CHEMICAL COMPANY, INC.), by mixing the polishing solution with water at a predetermined proportion (e.g., a weight proportion of 1:2) before immersing at room temperature for 1 minute and by performing cleaning with pure water, cleaning with dilute sulfuric acid (e.g., 0.1 N dilute sulfuric acid), cleaning with pure water once again and drying. Alternatively, the metal foil may be immersed in 1 mass % hydrogen peroxide solution and then washed with ultrapure water. The dry-ice blasting method can be performed, for example, with a commercially available apparatus such as a dry-ice snow system (manufactured by Air WATER INC.), which sprays carbon dioxide solidified at low temperature against the back surface 12b by ejecting carbon dioxide gas compressed at high pressure through a fine nozzle. In the step of electrodeposition of an electrolytic copper foil, a surface profile of the electrolytic copper foil can be controlled by appropriate adjustment of the quantity of additives such as organic substances and chlorine, if they are added. In this case, any post-treatment (e.g., the ultrasonic cleaning, chemical polishing, dry-ice blasting treatment, and CMP treatments) may be appropriately selected depending on the surface smoothness of the resulting metal foil.

The metal foil 12 may have any thickness which allows the metal foil to retain sufficient flexibility and be handled alone as a foil. The thickness of the metal foil 12 may be in the range of from 1 μm to 250 μm, preferably from 5 μm to 200 μm, more preferably from 10 μm to 150 μm, and most preferably from 15 μm to 100 μm and may be appropriately determined according to the applications, the characteristics, or the like required for the electrode foil. If further reductions in the amount and weight are required, the upper limit of the thickness is preferably 50 μm, 35 μm, or 25 μm. If further strength is required, the lower limit of the thickness is preferably 25 μm, 35 μm, or 50 μm. A metal foil with such a thickness can be cut readily with a commercially available cutting machine. Unlike glass substrates, the metal foil 12 does not have disadvantages such as cracking and chipping, but has an advantage of not easily generating particulate matter during cutting or the like. The metal foil 12 may be formed into various shapes, such as circle, triangle, and polygon, other than tetragon, and can also be cut and pasted to fabricate electronic devices with a three-dimensional shape, such as a cubic shape or a spherical shape since the metal foil can be cut and welded. In this case, it is preferred that a semiconductor functional layer be not formed at a cutting or welding portion of the metal foil 12.

The metal foil 12 of the present invention may have any length, and preferably have a length enough to be applicable to a roll-to-roll process. The length of the metal foil, which depends on the specifications or the like of the device, is preferably at least about 2 m, and from the viewpoint of productivity, more preferably at least 20 m, still more preferably at least 50 m, particularly preferably at least 100 m, most preferably at least 1000 m. The width of the metal foil 12 which depends on the specifications or the like of the device is preferably at least about 150 mm, and from the viewpoint of productivity, more preferably at least 350 mm, still more preferably at least 600 mm, particularly preferably at least 1000 mm. As described above, the metal foil of the present invention can effectively does not form scratches caused during a winding operation, and thereby does not require any measures against roll scratches, for example, providing more resilient material than the electrode foil, such as a film or embossed film interposed between the front and back surfaces, resulting in simplification of handling of the rolled metal foil.

The ultra-smooth surface 12a and concave-dominant surface 12b are preferably washed with an alkaline solution. A known alkaline solution, such as an ammonia-containing solution, a sodium hydroxide solution, and a potassium hydroxide solution can be used. The alkaline solution is preferably an ammonia-containing solution, more preferably an organic alkaline solution containing ammonia, most preferably a tetramethylammonium hydroxide (TMAH) solution. The preferred concentration of the TMAH solution ranges from 0.1 wt % to 3.0 wt %. An example of the washing described above involves washing at 23° C. for one minute with a 0.4% TMAH solution. A similar washing effect can also be attained by UV (Ultra Violet) treatment in combination with or in place of the washing with the alkaline solution. Furthermore, oxides formed on the surface of, for example, copper foil can be removed with an acidic washing solution such as dilute sulfuric acid. An example of the acid washing involves washing for 30 seconds with dilute sulfuric acid.

It is preferred that particles on the ultra-smooth surface 12a and concave dominant surface 12b be removed. Examples of effective removal techniques of particles include sonic washing with ultra-pure water and dry-ice blasting. Dry-ice blasting is more effective. The dry-ice blasting involves ejecting highly compressed carbon dioxide gas through a fine nozzle and thereby squirting the ultra-smooth surface 12a with carbon dioxide solidified at low temperature to remove the particles. Unlike wet processes, the dry-ice blasting has advantages of no drying process, readily removable organic substances, or the like. The dry-ice blasting can be performed with a commercially available apparatus, such as a dry-ice snow system (manufactured by AIR WATER INC.). When the particles have been already removed by such treatment to provide a Pv/Pp ratio of 1.5 or more to the back surface 12b (e.g., the dry-ice blasting method), this particle removal process can be omitted.

Electrode Foil

Figure 2:
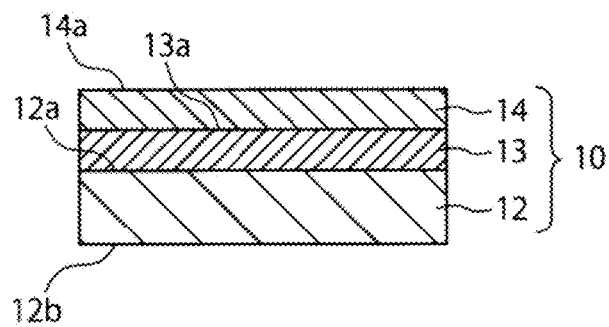
FIG. 2 is a schematic cross-sectional view illustrating an example of an electrode foil including a metal foil of the present invention.

The metal foil of the present invention is preferably used alone or in a lamination with one or other functional layers as an electrode foil. FIG. 2 is a schematic cross-sectional view illustrating an electrode foil 10. The electrode foil 10 shown in FIG. 1 comprises a metal foil 12. The electrode foil 10 may optionally comprise a reflective layer 13 provided directly on the ultra-smooth surface 12a of the metal foil 12, or on an antidiffusion layer provided on the ultra-smooth surface 12a. Furthermore, the electrode foil 10 may optionally include a buffer layer 14 provided directly on the ultra-smooth surface 12a of the metal foil 12 or on the surface 13a of the reflective layer 13, if present. Although the electrode foil 10 shown in FIG. 2 has a triple-layer structure composed of the metal foil 12, the reflective layer 13, and the buffer layer 14, the electrode foil of the present invention is not limited thereto but may be a single-layer structure composed of the metal foil 12 or a double-layer structure composed of the metal foil 12 and the reflective layer 13. Alternatively, it may be a quintuple-layer structure composed of the reflective layers 13 and the buffer layers 14 provided on both sides of the metal foil 12.

Thus, use of the metal foil 12 as a supporting substrate and an electrode provides an electrode foil which functions as both a supporting substrate and an electrode. Particularly, the metal foil 12 having a thickness in an appropriate range (preferably 1 µm to 250 µm) can be used as an electrode functioning as a supporting substrate for a flexible electronic device. In production of such a flexible electronic device, the electrode foil 12 of the present invention can be manufactured efficiently, for example, by a roll-to-roll process without a particular supporting substrate because the electrode foil 12 is based on a metal foil. The roll-to-roll process is a significantly advantageous process in terms of efficient mass production of electronic devices, in which a long foil is wound off a roll, subjected to a predetermined process and rewound; therefore the roll-to-roll process is a key process to achieve mass production of electronic devices such as a light-emitting element and a photoelectric element, which belong to the application field of the present invention. Thus, the electrode foil of the present invention does not require a supporting substrate or a reflecting layer. The electrode foil of the present invention, therefore, has preferably no insulating layer at least on a portion where the electronic device is to be disposed, and more preferably no insulating layers on any portion.

The reflective layer 13 may be optionally provided directly on the ultra-smooth surface 12a of the metal foil 12 or on an antireflective layer provided on the ultra-smooth surface. The reflective layer 13 is preferably composed of at least one metal or alloy selected from the group consisting of aluminum, aluminum alloys, silver, and silver alloys. These materials are suitable for a reflective layer due to high optical reflectivity and thin films formed thereof also have excellent smoothness. In particular, inexpensive aluminum or aluminum alloys are preferred. A wide variety of aluminum alloys and silver alloys having conventional alloy compositions can be used as an anode or a cathode of a light-emitting element or a photo-electric element. Preferred examples of the aluminum alloy compositions include Al—Ni; Al—Cu; Al—Ag; Al—Ce; Al—Zn; Al—B; Al—Ta; Al—Nd; Al—Si; Al—La; Al—Co; Al—Ge; Al—Fe; Al—Li; Al—Mg; and Al—Mn. Any element that constitutes these alloys may be combined thereof, depending on required characteristics. Preferred examples of the silver alloy compositions include Ag—Pd; Ag—Cu; Ag—Al; Ag—Zn; Ag—Mg; Ag—Mn; Ag—Cr; Ag—Ti; Ag—Ta; Ag—Co; Ag—Si; Ag—Ge; Ag—Li; Ag—B; Ag—Pt; Ag—Fe; Ag—Nd; Ag—La; and Ag—Ce. Any element that constitutes these alloys may be combined thereof, depending on required characteristics. The reflective layer 13 can have any thickness; and preferably has 30 nm to 500 nm, more preferably 50 nm to 300 nm, and most preferably 100 nm to 250 nm.

The reflective layer 13, in the case of being composed of an aluminum film or an aluminum alloy film, can have a laminate structure including at least two layers. In the above embodiment, the reflective layer 13 has a laminate structure of two layers which are separated from each other by an interface, across which the lower layer and the upper layer have different crystal orientations. Thus, even if the electrode foil is exposed to a considerably high temperature, thermal migration that may occur from the interface between the copper foil and the aluminum-containing reflective layer can be effectively reduced to prevent deterioration of the surface smoothness and optical reflectivity caused by the thermal migration. That is, the heat resistance of the electrode foil can be improved. Accordingly, the above embodiment is particularly effective in heat treatment which is performed at a temperature of 200° C. or higher, preferably 230° C. or higher, and more preferably 250° C. or higher after the hole injection layer is coated. The improved heat resistance is probably due to blocking the thermal migration preferential in crystal boundaries by the interfaces where the crystal boundaries discontinue. The number of the interfaces in the reflective layer 13 may be two or more, which means that the reflective layer is a laminate structure of three or more layers.

The antidiffusion layer optionally provided between the metal foil 12 and the reflective layer 13 can be any layer that has a function of preventing diffusion of metal atoms from the metal foil and can employ various known compositions and structures. Thus, even if the electrode foil is exposed to a considerably high temperature, thermal migration that may occur from the interface between the copper foil and the aluminum-containing reflective layer can be effectively reduced to prevent deterioration of the surface smoothness and optical reflectivity caused by the thermal migration. That is, the heat resistance of the electrode foil can be enhanced. Accordingly, the above embodiment is particularly effective in heat treatment which is performed at a temperature of 200° C. or higher, preferably 230° C. or higher, and more preferably 250° C. or higher after the hole injection layer is coated. The antidiffusion layer may have a layer structure composed of two or more sublayers.

It is preferred that the buffer layer 14 be provided directly on the outermost surface of at least one of the metal foil 12 and the reflective layer 13, if present, and the surface of the buffer layer be the light-scattering surface. In the light-emitting element or the photo-electric element, the buffer layer 14 can be any layer that can provide a desired work function after coming into contact with a semiconductor functional layer. The buffer layer in the present invention is preferably transparent or translucent to ensure high light scattering effect.

The buffer layer 14 is preferably at least one selected from the group consisting of an conductive amorphous carbon film, an conductive oxide film, a magnesium alloy film, and a fluoride film, and may be selected as needed depending on applications such as an anode or a cathode of the electronic device and required performances.

The electrode foil or the metal foil of the present invention can be preferably used as an electrode (i.e., anode or cathode) for various electronic devices. The electrode foil of the present invention, which can be readily bent at low stress, is particularly preferably used as an electrode for flexible electronic devices, and it may also be used for less flexible or more rigid electronic devices. Examples of the electronic devices (mainly flexible electronic devices) include i) light-emitting elements (e.g., an organic EL element, an organic EL lighting device, an organic EL display, an electronic paper display, a liquid crystal display, an inorganic EL element, an inorganic EL display, LED lighting device, and LED display; ii) photoelectric elements (e.g., a thin film solar cell); preferably an organic EL element, an organic EL lighting device, an organic EL display, an organic solar cell, and a dye-sensitized solar cell, and more preferably an organic EL lighting device because it is significantly thin and emits light of high luminance. The electrode foil of the present invention can be preferably used for an anode or a cathode of the organic solar cell because many characteristics required for the electrode of the organic solar cell are in common with those of the organic EL element. Accordingly, appropriate selection of the type of an organic semiconductor functional layer to be laminated on the electrode foil of the present invention in accordance with known techniques makes it possible to construct an organic device as any one of the organic EL element and the organic solar cell.

The both surfaces of the metal foil or the electrode foil of the present invention may have an ultra-smooth surface profile. This is advantageous for providing electronic devices on the both surfaces of the electrode foil, and thereby a double-sided functional element or a double-sided functional element foil comprising the electronic devices on the both surfaces can be provided. Furthermore, the present invention enables formation of a light-emitting element on one side and a power-generating element on the other side of the same electrode, which configuration provides a novel composite electronic device that has combined functions of the organic EL element and the organic solar cells. Furthermore, the electrode foil of the present invention can be used for not only the electrode of the organic EL element, but also a mounting substrate for the LED. In particular, the electrode foil of the present invention can be preferably used as an anode or a cathode for the LED lighting device since the LED elements can be densely mounted thereon.

Electronic Device

The metal foil or the electrode foil including the metal foil of the present invention can provide an electronic device comprising a semiconductor functional layer having semiconductive properties provided on the light-scattering surface of the electrode foil, and preferably comprising the semiconductor functional layer provided directly on the light-scattering surface. The semiconductor functional layer may be of any material and structure having semiconductor characteristics that can exhibit the desired functions on an electrode or between the electrodes. An organic semiconductor, an inorganic semiconductor, or mixtures or combinations thereof are preferred. For example, the semiconductor functional layer preferably has a function of excited luminescence or photoexcited power generation, so that the electronic device can function as a light-emitting element or a photoelectric element. Furthermore, the light-emitting element and the photoelectric element are preferably provided with a transparent or translucent counter electrode on the semiconductor functional layer. The process of dissolving a polymer material or a low molecular material in such a solvent as chlorobenzene and applying the solution is preferably applicable to the process of forming the semiconductor functional layer on the electrode foil of the invention, and an in-line vacuum process, which is suitable for improving productivity, is also applicable. As described above, the semiconductor functional layer may be provided on both sides of the electrode foil.

(1) Organic EL Element and Organic EL Lighting Device

A light-emitting element or an organic EL lighting device which is provided with a top-emission organic EL element on the light-scattering surface can be constructed with the electrode foil of the present invention as a reflective electrode.

Figure 3:
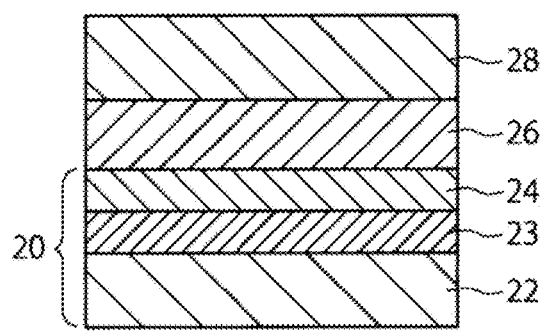
FIG. 3 is a schematic cross-sectional view illustrating an example of an organic EL element including an anode of the metal foil of the present invention.

FIG. 3 shows an example layer structure of a top-emission EL element that includes the electrode foil of the present invention as an anode. The organic EL element depicted in FIG. 3 comprises an anodic electrode foil 20 comprising a metal foil 22, reflective layers 23 and optionally buffer layers 24; organic EL layers 26 provided directly on the buffer layer 24; and cathode 28 as light-transmitting electrodes provided directly on the organic EL layer 26. The buffer layer 24 is preferably composed of a conductive amorphous carbon film or a conductive oxide film suitable for an anode.

The organic EL layer 26 may have various known EL layer structures used for organic EL elements and may comprise optionally a hole injection layer and/or a hole transport layer, a light-emitting layer, and optionally an electron transport layer and/or an electron injection layer in this order from the anodic electrode foil 20 to the cathode 28. Any known structure or composition may be appropriately applied to each of the hole injection layer, the hole transport layer, the light-emitting layer, the electron transport layer, and the electron injection layer, without any particular limitation.

Figure 4:
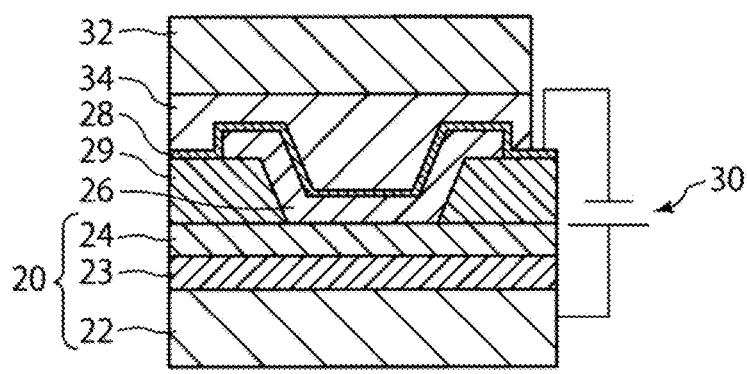
FIG. 4 is a schematic cross-sectional view illustrating an example of a top-emission organic EL lighting device of the present invention.

FIG. 4 illustrates an example layer structure of a top-emission organic EL lighting device incorporating organic EL elements depicted in FIG. 3. In the organic EL lighting device depicted in FIG. 4, the organic EL element is electrically connectable with a power source 30 through the metal foil 22 of the anodic electrode foil 20. The surface area, not in contact with the organic EL layer 26, of the buffer layer 24 is covered with an interlayer insulating film 29. The interlayer insulating film 29 is preferably a Si-based insulating film, more preferably a SiN-based insulating film formed by CVD, which exhibits high barrier properties against water and oxygen that cause degradation of organic layers. A more preferred film is a SiNO-based insulating film, which has small internal stress and high flexibility.

Sealing materials 32 is disposed above the cathode 28 of the organic EL element. The gap between the sealing material 32 and the cathode 28 is filled with a sealing resin to form a sealing film 34. The sealing material 32 may be composed of a glass sheet or a film. In the case of a glass sheet, the sealing material 32 may be bonded directly onto the sealing film 34 using a hydrophobic adhesive tape. In the case of a film, both surfaces and end faces thereof may be covered with a Si-based insulating film. If a film having high barrier properties is developed in future, sealing suitable for mass production would be possible without such preliminary coating treatment. Although films having high flexibility are preferable as the sealing material 32, the required performance can be achieved with a sealing material formed of a film bonded to a significantly thin glass sheet having a thickness of 20 μm to 100 μm.

The cathode 28 may be composed of any of known transparent or translucent materials used in top-emission organic EL elements requiring light transmission. Materials having low work functions are preferred. Examples of the material for preferable cathodes include conductive oxide films, magnesium alloy films, and fluoride films. A combination of two or more layers of these materials is more preferred. The usable films are similar to those described for the buffer layer of the electrode foil.

A particularly preferable cathode has a double-layer laminated structure including a translucent metal layer as a buffer layer composed of a magnesium alloy film and/or a fluoride film and a transparent oxide layer as a cathode layer composed of a conductive oxide film. This structure is highly useful in terms of resistance characteristics. In this case, a high optical transparency and a low work function can be provided by bringing the translucent metal layer (buffer layer) of the cathode 28 into contact with the organic EL layer 26, resulting in enhanced brightness and power efficiency of the organic EL element. The most preferred example is a laminated cathode structure of a transparent oxide layer (cathode layer) composed of indium zinc oxide (IZO) and a translucent metal layer (buffer layer) composed of Mg—Ag. Furthermore, the cathode structure may have two or more transparent oxide layers and/or two or more translucent metal layers. Thus, the light generated in the organic EL layer 26 passes through the cathode 28, the sealing film 34, and then the sealing material 32 to be emitted to the outside.

On the back surface of the electrode foil 20, an auxiliary substrate may be appropriately provided depending on the type of application. Since this portion does not affect light emission performance, any material may be selected with a high degree of freedom. For instance, a flexible resin film, such as poly(ethylene terephthalate) (PET), polyimide (PI), polycarbonate (PC), polyethersulfone (PES), and polyethernitrile (PEN), can be appropriately used.

Figure 5:
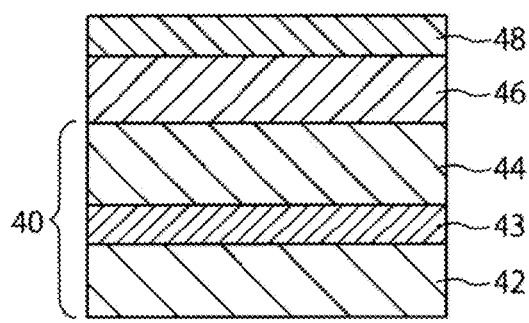
FIG. 5 is a schematic cross-sectional view illustrating an example of an organic EL element including a cathode of the metal foil of the present invention.

FIG. 5 illustrates an example layer structure of a top-emission organic EL element including the electrode foil of the present invention as a cathode. The organic EL element depicted in FIG. 5 includes a cathodic electrode foil 40 comprising a metal foil 42, reflective layers 43 and buffer layers 44; organic EL layers 46 provided directly on the buffer layer 44; and anodes 48 as counter electrodes provided directly on the organic EL layer 46. The organic EL layer 46 may have a configuration similar to the organic EL layer 26 depicted in FIG. 3. The buffer layer 44 may also have a configuration similar to the cathode 28 depicted in FIG. 3, and preferably composed of a conductive oxide film, a magnesium alloy film, a fluoride film, or a combination of two or more thereof. More preferably, the buffer layer 44 is a translucent metal layer composed of a magnesium alloy film and/or a fluoride film.

More specifically, the organic EL element including the cathodic electrode foil 40 depicted in FIG. 5 corresponds to a structure of the organic EL element including the anodic electrode foil 20 depicted in FIG. 3, except that the buffer layers 24 and the cathodes 28 are interchanged, respectively, and the order of the layers from the anodes inside the organic EL layer 26 to the cathodes is inverted. In a preferred embodiment, a magnesium alloy film or a fluoride film as the buffer layer 44 of the cathodic electrode foil 40 is formed by sputtering or vapor deposition while a film composed of conductive amorphous carbon, $MoO_3$, or $V_2O_5$ as the anode 48 is formed by vapor deposition. In particular, a conductive amorphous carbon film is preferably formed on the organic EL layer by vacuum deposition to avoid plasma damaging during sputtering.

(2) Photoelectric Element

A photoelectric elements may be formed on the light-scattering surface of the electrode foil of the present invention as a reflective electrode. The photoelectric element according to a preferable embodiment of the present invention includes an electrode foil, a photoexcitation layer as a semiconductor functional layer provided directly on the surface of the electrode foil, and a light-transmitting counter electrode provided directly on the surface of the photoexcitation layer. The photoexcitation layer may have various structures and may be composed of materials which are known as semiconductor functional layers of photoelectric elements.

For example, the organic EL layer 26 depicted in FIG. 3 may be replaced with a known organic solar cell active layer to construct an organic solar cell. The organic solar cell including the electrode foil of the present invention as an anode can be disposed on a buffer layer (e.g., a carbon buffer layer) by depositing a hole transport layer (PEDOT:PSS (30 nm)), a p-type organic semiconductor functional layer (e.g., BP (benzoporphyrin)), an i-type mixing layer (e.g., BP:P-CBNB (fullerene derivative) of an n-type organic semiconductor and a p-type organic semiconductor, an n-type organic semiconductor layer (e.g., PCBM (fullerene derivative)), a buffer layer having a low work function (e.g., Mg—Ag), and a transparent electrode layer (e.g., IZO) in this order. Furthermore, in another example, the metal foil (e.g., a copper foil) has a reflective layer (e.g., an aluminum film) and an n-type semiconductor buffer layer (e.g., an n-type oxide semiconductor such as $ZnO$, $SnO_2$, $TiO_2$, $NbO$, $In_2O_3$, $Ga_2O_3$ and combinations thereof), and the solar cell may be constructed by laminating a blend layer (e.g., P3HT:PCBM) of a p-type organic semiconductor and an n-type organic semiconductor, a hole transport layer (e.g., PEDOT:PSS) and an electrode in this order, on the n-type semiconductor buffer layer. Known materials may be appropriately used for these layers without any particular limitation. The electrode used for organic solar cells may be composed of the same materials and may have the same structures as an electrode used for organic EL elements. The electrode foil of the present invention comprises a reflective layer, which will increase the power generation efficiency by light confinement due to cavity effect.

The photoexcitation layer is composed of various known functional sublayers. These sublayers may be laminated from the electrode foil to the counter electrode in order. Alternatively, a first laminated portion of the electrode foil side and a second laminated portion of the counter electrode side may be separately prepared and then the first and the second laminated parts are bonded together to produce a photoelectric element including a desired photoexcitation layer.

EXAMPLES

The present invention will be further described in detail with reference to the following examples.

Example 1: Preparation and Evaluation of Double-Side Treated Copper Foil

The double-side treated copper foil of the present invention was prepared as follows. As metal foil, 35-μm thick commercially available electrolytic copper foil (DFF (Dual Flat Foil)), manufactured by Mitsui Mining & Smelting Co., Ltd.) was prepared. In the following description, the plated surface (Ra: 57 nm) is referred to as a "front surface" and the drum surface (Ra: 164 nm) of electrolytic copper foil as a "back surface". The front surface of the copper foil was subjected to chemical mechanical polishing (CMP) treatment with a polishing machine manufactured by MAT Inc. This CMP treatment was performed with a polishing pad having XY grooves and a colloidal silica polishing solution for 180 seconds under the conditions of a pad rotation speed of 50 rpm; a load of 170 gf/cm², and a solution supply rate of 30 cc/min. Thus, the front surface of the copper foil was provided with an ultra-smooth surface profile.

Furthermore, the back surface of the copper foil was subjected to CMP treatment with a polishing machine manufactured by MAT Inc., using a polishing pad having XY grooves and a colloidal silica polishing solution for 180 seconds under conditions of a pad rotation speed of 100 rpm; a load of 100 gf/cm², and a solution supply rate of 50 cc/min. The copper foil was then immersed in 1 mass % hydrogen peroxide solution and washed with ultrapure water to provide a concave-dominant surface profile to the back surface of the copper foil. The double-side treated copper was evaluated in accordance with the following evaluations 1 to 3.

Evaluation 1: Measurement of Ra and Pv/Pp Ratio

The maximum profile valley depth Pv to the maximum profile peak height Pp of a profile curve was determined on both surfaces of the resulting double-side treated copper foil with a non-contact profilometer (NewView5032, manufactured by Zygo Corp.) in a rectangular area of 181 μm by 136 μm in accordance with JIS B 0601-2001 to calculate a Pv/Pp ratio. At the same time, an arithmetic mean roughness Ra was determined in accordance with JIS B 0601-2001. The specific measurement condition and filtering condition were as follows.

Lens: 50×
ImageZoom: 0.8×
Measured area: 181 μm by 136 μm
Filter High: Automatic
Filter Low: Fixed (150 μm)

Figure 6:
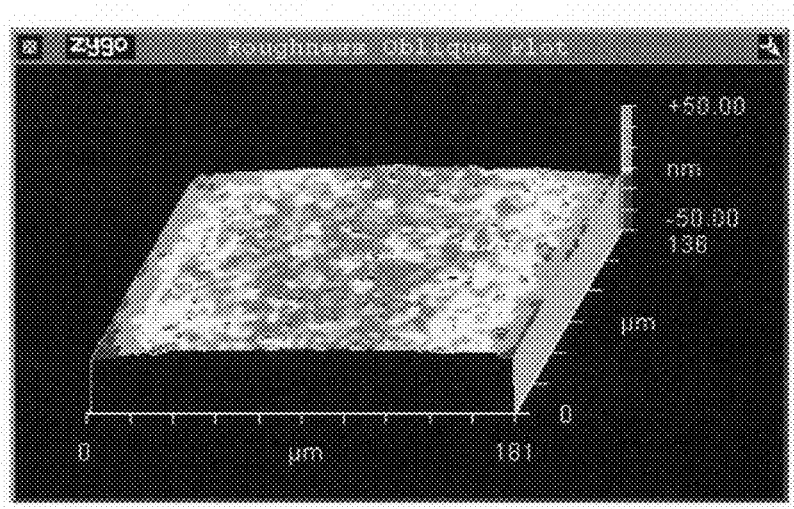
FIG. 6 is a three-dimensional profile of the front surface of double-side treated copper foil measured in Example 1.
Figure 7:
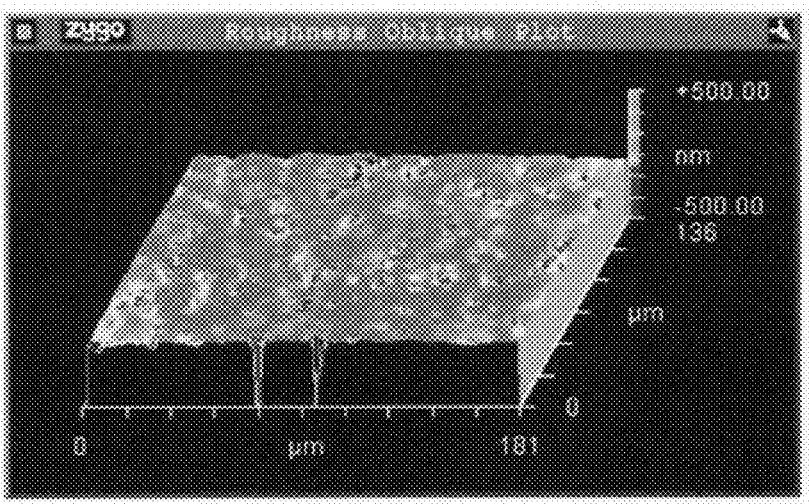
FIG. 7 is a three-dimensional profile of the back surface of double-side treated copper foil measured in Example 1.

As a result, the Ra and the Pv/Pp ratio of the front surface (ultra-smooth surface) of the double-side treated copper foil were 1.698 nm and 0.7127, respectively, while the Ra and the Pv/Pp ratio of the back surface (concave-dominant surface) of the foil were 11.407 nm and 5.4053, respectively. The three-dimensional profiles of the front surface and the back surface obtained with a non-contact profilometer are shown in FIG. 6 and FIG. 7, respectively.

Evaluation 2: Evaluation of Oxidation Resistance

Figure 8:
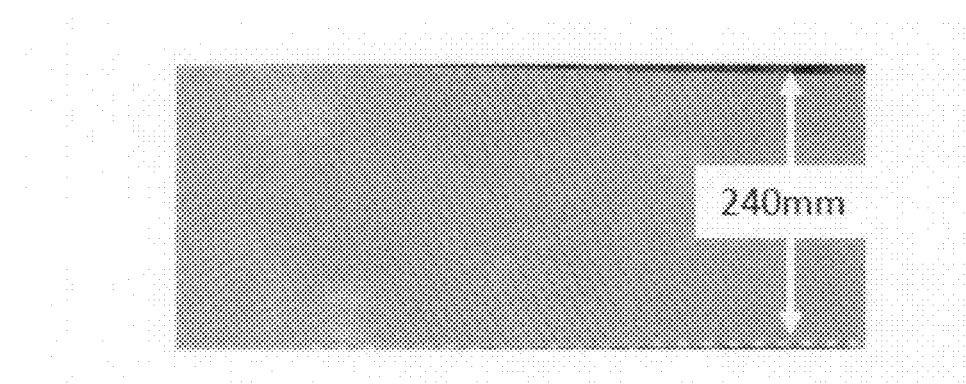
FIG. 8 is a photograph of the front surface of the double-side treated copper foil drawn from the roll that was left in atmosphere for 2 weeks in Example 1.

A double-side treated copper foil was left in a roll for 2 weeks in air. The double-side treated copper foil was drawn out from the roll and the surface of the foil was observed to have the appearance with metallic luster, as shown in FIG. 8. The oxidation state of the front surface of the copper foil after being left for 2 weeks was analyzed by a Cu-KLL Auger electron spectrum. This measurement was performed with an X-ray photoelectron spectroscopic (XPS) system (Quantum 2000, ULVAC-PHI Inc.) under the following conditions.

X-Ray source: Al
Output: 40 W
Beam diameter for measurement: 200 μmφ
Measured area: 300 μm by 900 μm (the beam was rastered in this range)
Surveying (for qualitative data): measured range=0 to 1400 eV, path energy=58.7 eV, step=1.0 eV, integrated time=20 minutes.
Narrow measurement (for standing data):
 For Cu2p: measured range: 925 to 975 eV, path energy: 23.5 eV, step: 0.1 eV, Number of integrations: 3
 For CuKLL: measurement range: 560 to 580 eV, path energy: 23.5 eV, step: 0.1 eV, Number of integrations: 3

Figure 9:
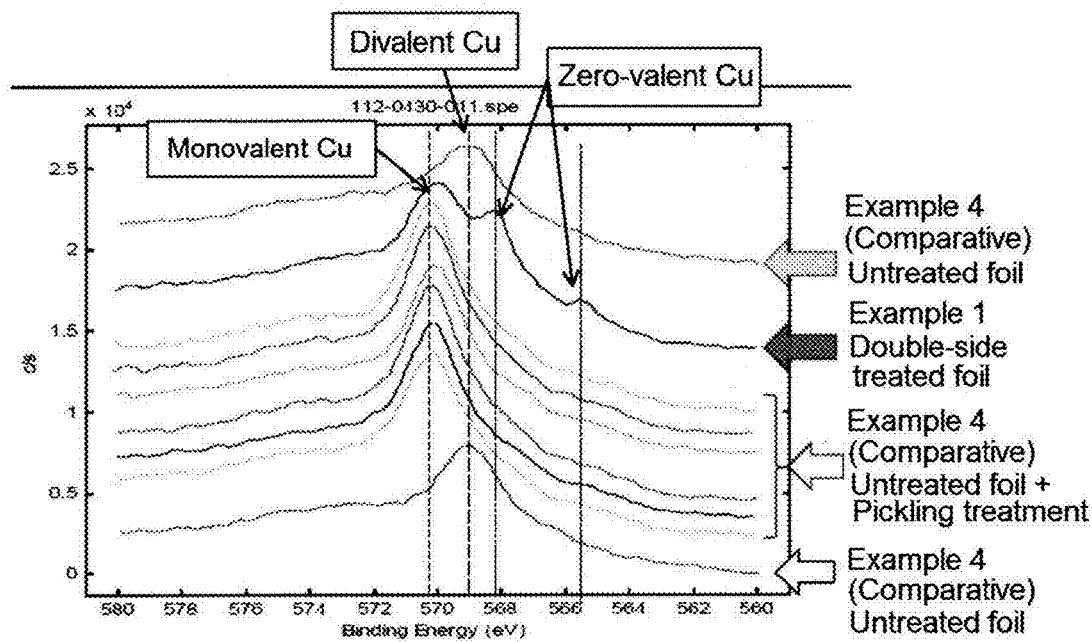
FIG. 9 is a Cu-KLL Auger electron spectrum measured for the copper foil in Examples 1 and 4.

The results are shown in FIG. 9, which indicate that peaks attributed to zero-valent Cu (i.e., metal Cu) was observed even after the double-side treated copper foil had been left in a roll for 2 weeks in air. Thus, delayed oxidation was confirmed in the double-side treated copper foil.

Figure 10:
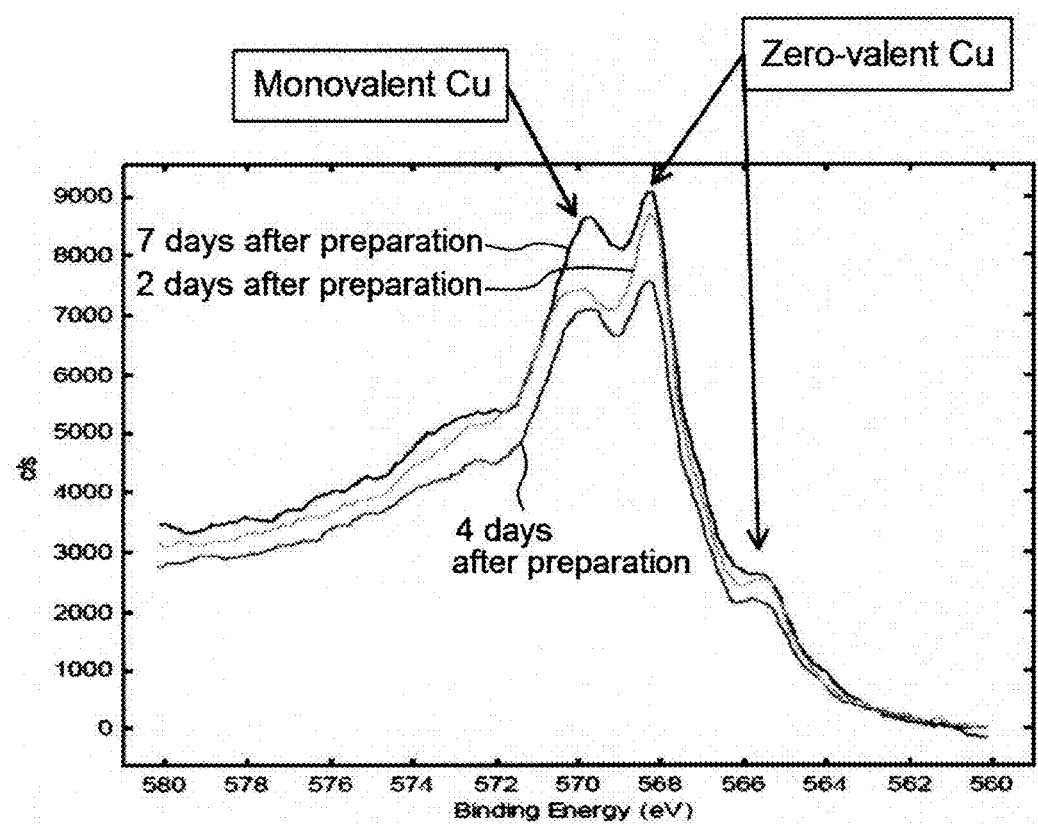
FIG. 10 is a Cu-KLL Auger electron spectrum measured by varying days after the preparation of the double-side treated copper foil in Example 1.

The Cu-KLL Auger electron spectra of the double-side treated copper foil were measured in the same manner as described above 2, 4, and 7 days after preparation of the foil to give the results in FIG. 10, in which peaks attributed to zero-valent Cu (i.e., metal Cu) were clearly observed in all these days. The ratios of zero-valent Cu to monovalent Cu, calculated on the basis of the peak height in FIG. 10, are shown in Table 1 below, which demonstrates that the content of metal Cu (zero-valent Cu) is the highest in any standing time, and therefore the double-side treated copper foil of the present invention has high oxidation resistance.

TABLE 1

| Standing time after preparation | Zero-valent | Monovalent | Zero-valent/Monovalent |
|---|---|---|---|
| 2 days | 8081 | 6267 | 1.29 |
| 4 days | 6962 | 6035 | 1.15 |
| 7 days | 8453 | 7438 | 1.14 |

Evaluation 3: Evaluation of Roll Scratches

Figure 11:
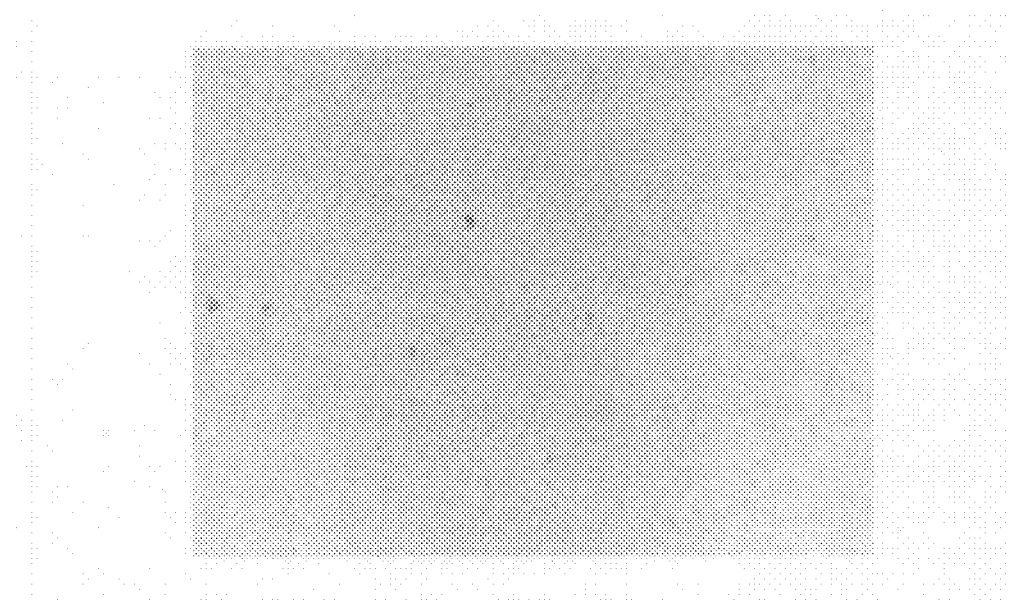
FIG. 11 is a laser microscope photograph of the front surface of the double-side treated copper foil after being left in a roll in Example 1.

The front surface of the double-side treated copper foil drawn out from the roll was observed with a laser microscope (OLS3000 manufactured by Olympus Corporation) to inspect roll scratches on the surface, and the photograph shown in FIG. 11 was obtained. The scale bar indicated in the lower right in the figure is 200 μm. As can be seen from FIG. 11, no significant roll scratch was observed on the front surface of the double-side treated copper foil of the present invention.

Example 2: Preparation and Evaluation of Double-Side Treated Copper Foil

Figure 12:
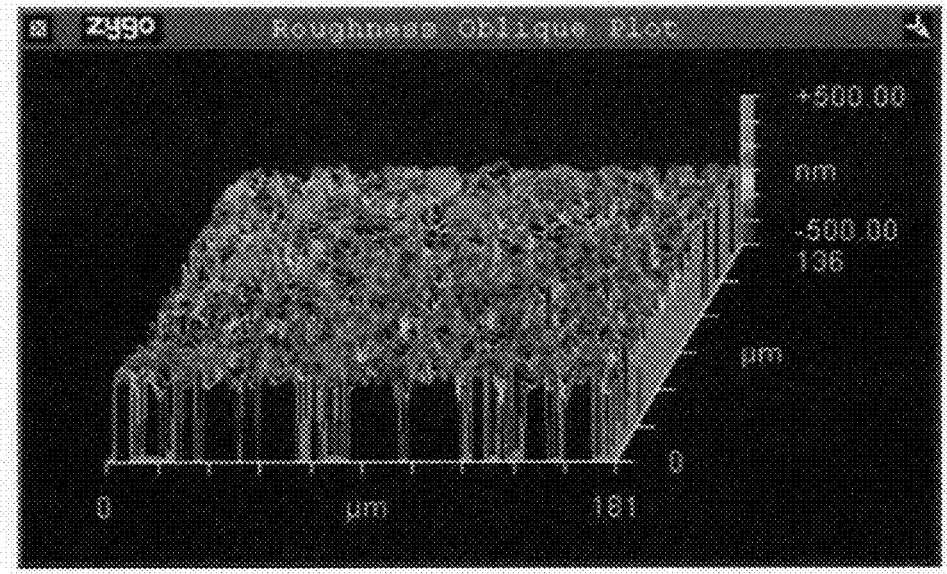
FIG. 12 is a three-dimensional profile of the back surface of the double-side treated copper foil measured in Example 2.

A double-side treated copper foil was prepared and evaluated as in Example 1 except that the time for CMP treatment on the back surface of the copper foil was 60 seconds. The resultant Ra and the Pv/Pp ratio of the front surface (ultra-smooth surface) of the double-side treated copper foil were 1.698 nm and 0.7127, respectively, while the Ra and the Pv/Pp ratio of the back surface (concave-dominant surface) of the foil were 56.072 nm and 2.3852, respectively. The three-dimensional profile of the front surface measured with a non-contact profilometer is similar to the profile shown in FIG. 6 and the three-dimensional profile of the back surface was as shown in FIG. 12. The front surface of the double-side treated copper foil, which had been left in a roll for 2 weeks in air, was observed to have a similar appearance to that shown in FIG. 8 of Example 1.

Figure 13:
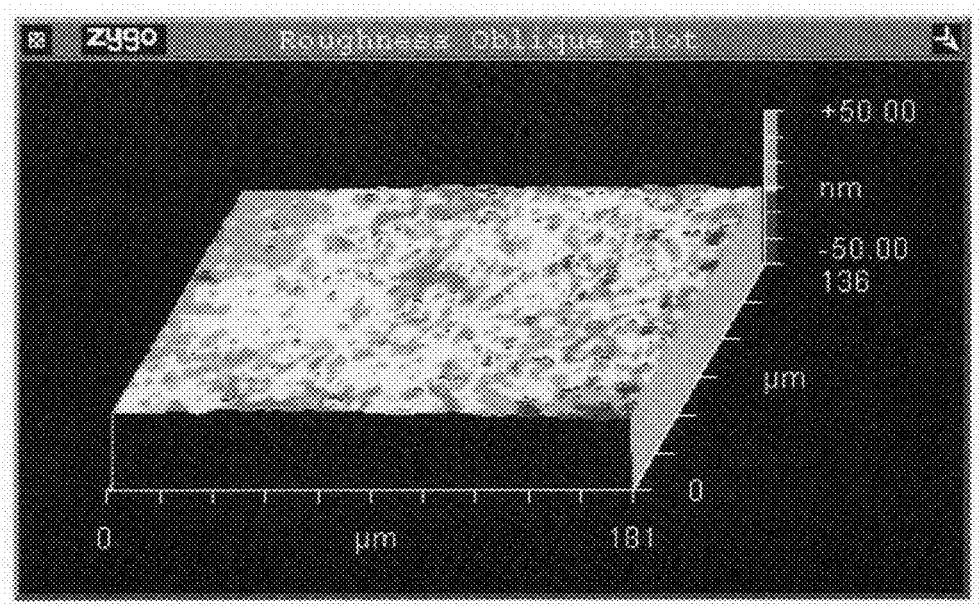
FIG. 13 is a three-dimensional profile of the front surface of the one-side treated copper foil measured in Example 3.
Figure 14:
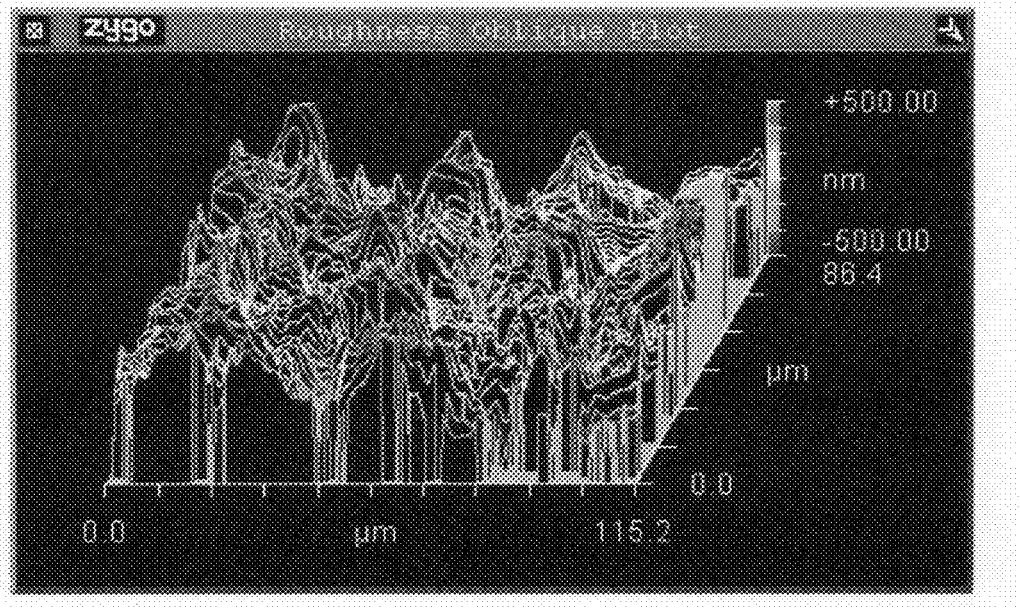
FIG. 14 is a three-dimensional profile of the back surface of the one-side treated copper foil measured in Example 3.
Figure 15:
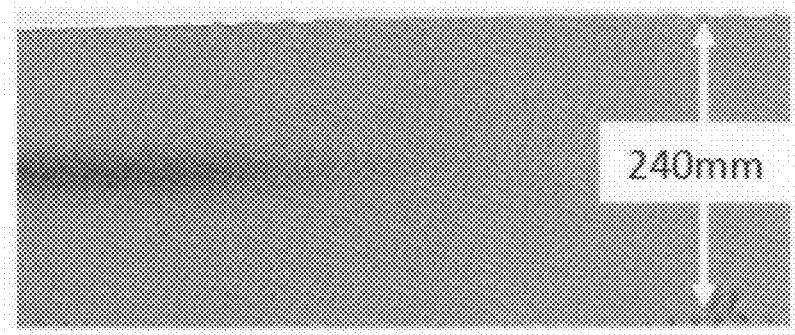
FIG. 15 is a photograph of the front surface of the one-side treated copper foil that was left in a roll for 2 weeks in atmosphere in Example 3.
Figure 16:
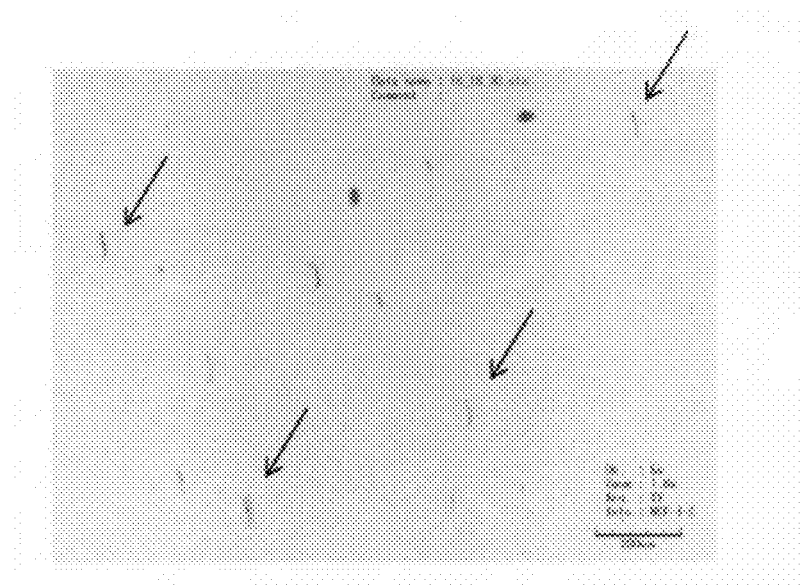
FIG. 16 is a laser microscope photograph of the front surface of the one-side treated copper foil drawn from the roll that was left in atmosphere for 2 weeks in Example 3. Arrows in the Figure point to roll scratches.

Example 3: (Comparative): Preparation and Evaluation of One-Side Treated Copper Foil A one-side treated copper foil was prepared and evaluated as in Examples 1 and 2 except that no treatment was given on the back surface of the copper foil. The Ra and the Pv/Pp ratio of the front surface (ultra-smooth surface) of the one-side treated copper foil were 1.313 nm and 1.3069, while the Ra and the Pv/Pp ratio of the back surface of the foil were 164.387 nm and 1.0711. The three-dimensional profiles of the front surface and the back surface measured with a non-contact profilometer are as shown in FIG. 13 and FIG. 14, respectively. The front surface of the one-side treated copper foil that had been left in a roll for 2 weeks in air was discolored brownish due to oxidation, as shown in FIG. 15. Accordingly, this demonstrates that, though the copper foil treated only on one side improved oxidation resistance to some degree, it still be readily oxidized in a roll. The front surface of the double-side treated copper foil drawn out from the roll was observed with a laser microscope (OLS3000 manufactured by Olympus Corporation) to inspect roll scratches on the surface, and the photograph is shown in FIG. 16. The scale bar indicated in the lower right in the figure is 200 μm. As is apparent from FIG. 16, several isolated roll scratches were visible on the front surface of the one-side treated copper foil.

Figure 17:
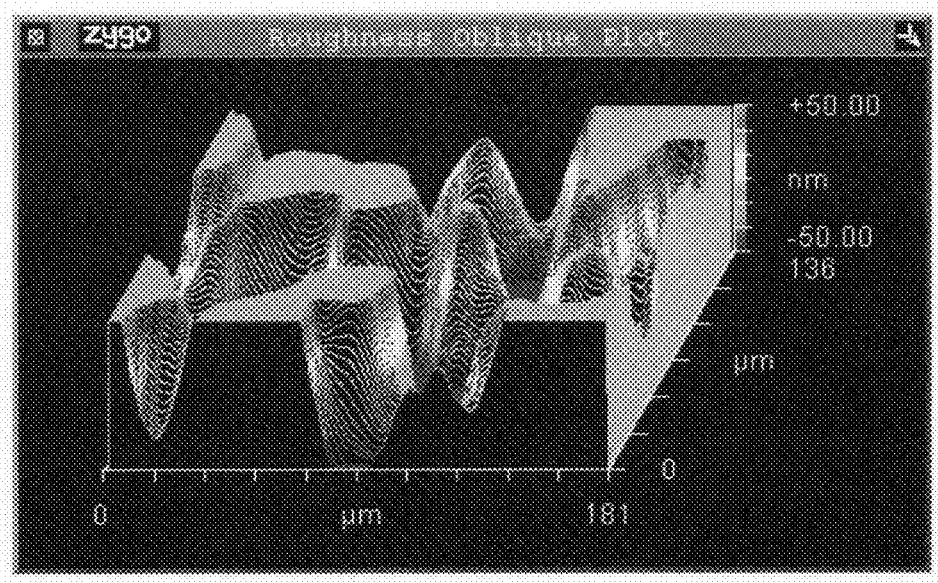
FIG. 17 is a three-dimensional profile of the front surface of the double-side untreated copper foil measured in Example 4.
Figure 18:
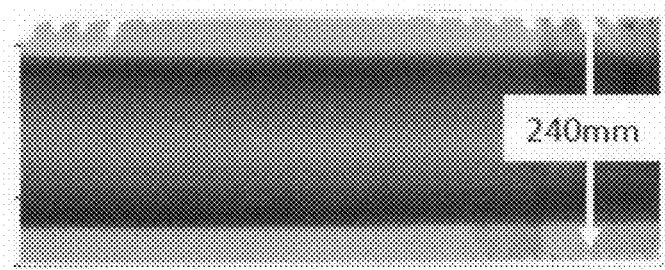
FIG. 18 is a photograph of the front surface of the double-side untreated copper foil drawn from the roll that was left in atmosphere for 2 weeks in Example 4.

Example 4: (Comparative): Preparation and Evaluation of Both-Side Untreated Copper Foil A both-side untreated copper foil was prepared and evaluated in the same manner as in Examples 1 to 3 except that no treatment was carried out on both surfaces of the copper foil. The Ra and the Pv/Pp ratio of the front surface of the both-side untreated copper foil were 57.213 nm and 0.9856, respectively, while the Ra and the Pv/Pp of the back surface of the foil were 164.387 nm and 1.0711, respectively. The three-dimensional profile of the front surface measured with a non-contact profilometer is shown in FIG. 17, while the three-dimensional profile of the back surface is similar to the profile shown in FIG. 14 of Example 3. As shown in FIG. 18, the front surface of the both-side untreated copper foil, which had been left in a roll for 2 weeks in air, was discolored much more brownish due to oxidation than the one-side untreated copper foil in Example 3. Accordingly, the both-side untreated copper foil was significantly readily oxidized in a roll. The resulting Cu-KLL Auger electron spectrum indicates that the peaks attributed to zero-valent Cu (i.e., metal Cu) was not observed after the double-side untreated copper foil had been left in a roll for 2 weeks in air, as shown in FIG. 9. Thus, the both-side untreated copper was confirmed to be easily oxidized.

Furthermore, an attempt was made to remove the oxide layer from the both-side untreated copper foil with dilute sulfuric acid. It was found that the high resistance divalent CuO layer was removed, but 2 days after pickling, the surface of the foil was covered with an oxide film of monovalent $Cu_2O$. The Cu-KLL Auger electron spectrum of the both-side untreated copper foil, which was pickled after being left in a roll for 2 weeks in air, is shown in FIG. 9 which clearly indicates that the surface of the foil is covered with the oxide layer of monovalent Cu (i.e., $Cu_2O$) regardless of an attempt to remove the oxide layer. This result demonstrates that such an oxidation resistant surface as achieved by the both-side treated copper foil of the present invention cannot be attained by mere pickling treatment.

Example 5: Evaluation of Scratches that Cause Dark Spots in Various Pv/Pp Ratios Five both-side treated copper foils having different surface profiles (Samples 1 to 5) were prepared as in Example 1 except that conditions of back surface treatment (especially polishing time) were appropriately varied. Conditions of the back surface treatment of Samples 4 and 5 were set to give the back surface a luster, while those of Samples 1 to 3 were set to give less luster. The Ra's and Pv/Pp ratios of the back surfaces of Samples 1 to 5 thus prepared were determined. Samples 1 to 5 each were stored in a rolled state. Then the number of roll scratches per unit area on the front surface of the foil was counted and gouged scratches, which might cause dark spots (not shallow scratches, but scratches having deeply gouged shape), were also examined among roll scratches. The number of roll scratches was counted by microscopy of an area of 2560 µm by 1920 µm on the surface of the foil at a magnification of 125 times. The surface of the foil was observed with SEM at a magnification of 5000 times to evaluate the gouged scratches on the surface of the foil. The depths of the gouged scratches identified on Samples 2 and 3 and the depth of the deepest scratch among scratches identified on Sample 4 were measured with a laser microscope (OLS3000 manufactured by Olympus Corporation). These results are shown in Table 2 and FIGS. 19 to 23.

TABLE 2

Figure 19:
FIG. 19 is a SEM image of scratches which occurred on the front surface of Sample 1 (Pv/Pp ratio of the back surface=0.75) in Example 5.
Figure 20:
FIG. 20 is a SEM image of scratches which occurred on the front surface of Sample 2 (Pv/Pp ratio of the back surface=0.91) in Example 5.
Figure 21:
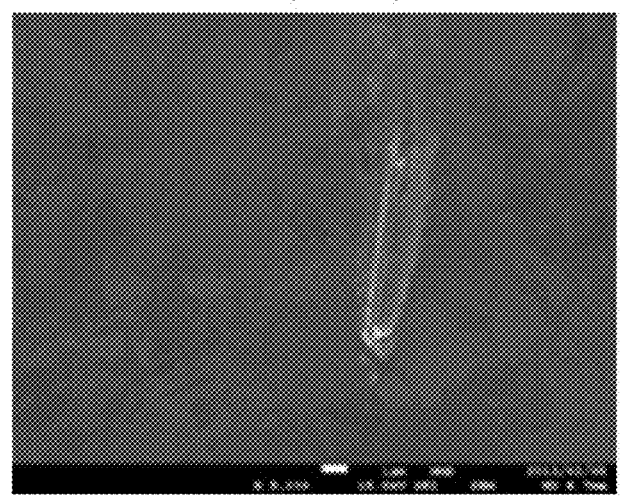
FIG. 21 is a SEM image of scratches which occurred on the front surface of Sample 3 (Pv/Pp ratio of the back surface=1.02) in Example 5.
Figure 22:
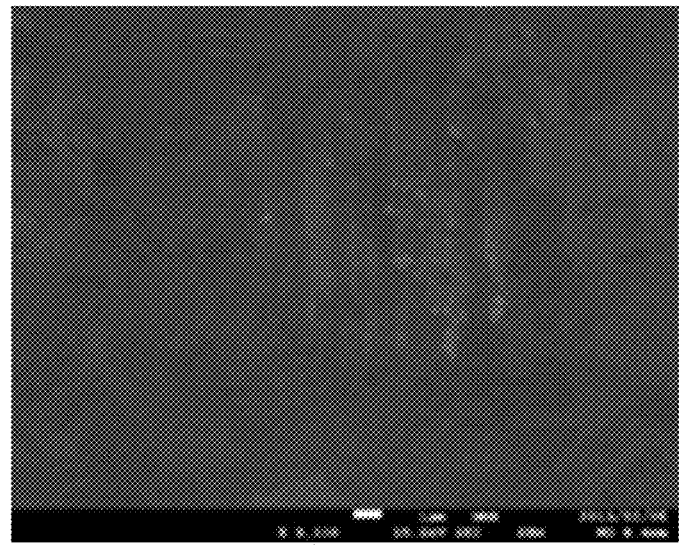
FIG. 22 is a SEM image of scratches which occurred on the front surface of Sample 4 (Pv/Pp ratio of the back surface=1.10) in Example 5.
Figure 23:
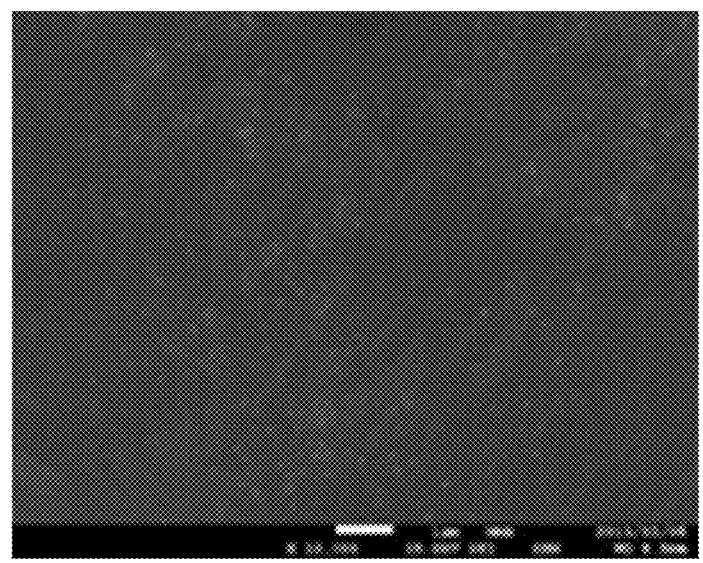
FIG. 23 is a SEM image of scratches which occurred on the front surface of Sample 5 (Pv/Pp ratio of the back surface=2.57) in Example 5.

| | Sample No. | | | | |
|---|---|---|---|---|---|
| | 1 (Comp.) | 2 (Comp.) | 3 (Comp.) | 4 | 5 |
| Pv/Pp of back surface of foil | 0.75 | 0.91 | 1.02 | 1.10 | 2.57 |
| Ra of back surface of foil (nm) | 97 | 82 | 82 | 56 | 27 |
| Number of roll scratches per unit area on front surface of foil (scratches/mm$^2$) | 4.1 | 3.7 | 3.7 | 3.9 | 3.9 |
| SEM image of scratches on front surface of foil | FIG. 19 | FIG. 20 | FIG. 21 | FIG. 22 | FIG. 23 |
| Gouged scratches on front surface of foil | Found | Found | Found | Not found | Not found |
| Depth of gouged scratches (µm) | — | 0.6 | 0.2 | less than 0.1 | — |

As shown in Table 2, while gouged scratches which may cause dark spots on the surfaces of Samples 1 to 3 having Pv/Pp ratios of less than 1.10 were observed (refer to FIGS. 19 to 21), such gouged scratches were not observed on the surfaces of Samples 4 and 5 having Pv/Pp ratios of 1.10 or more (refer to FIGS. 22 and 23). In this respect, the back surface (concave-dominant surface) of the foil having a Pv/Pp ratio of 1.10 or more can undergo significantly reduced gouged scratches described above on the front surface of the foil drawn out from the roll, and thus can provide a high-performance light-emitting device having significantly reduced dark spots. In terms of achieving such effects, Ra of the back surface (concave-dominant surface) of the foil is preferably 80 nm or less, more preferably 70 nm or less, still more preferably 60 nm or less, particularly preferably 50 nm or less, particularly more preferably 40 nm or less, most preferably 30 nm or less.

The invention claimed is:

1. A metal foil comprising copper or copper alloy, the metal foil having a front surface and a back surface, wherein
the front surface has an ultra-smooth surface profile having an arithmetic mean roughness Ra of 30 nm or less as determined in accordance with JIS B 0601-2001, and
the back surface has a concave-dominant surface profile having a Pv/Pp ratio of 2.0 or more, the Pv/Pp ratio being a ratio of a maximum profile valley depth Pv to a maximum profile peak height Pp of a profile curve as determined in a rectangular area of 181 µm by 136 µm in accordance with JIS B 0601-2001.

2. The metal foil according to claim 1, wherein the ultra-smooth surface profile has an arithmetic mean roughness Ra of 10 nm or less.

3. The metal foil according to claim 1, wherein the concave-dominant surface profile has a Pv/Pp ratio of 3.0 or more.

4. The metal foil according to claim 1, wherein the concave-dominant surface profile has an arithmetic mean roughness Ra of 30 nm or less as determined in accordance with JIS B 0601-2001.

5. The metal foil according to claim 1, wherein the metal foil has a thickness of 1 to 250 µm.

6. The metal foil according to claim 1, wherein the metal foil is used as an electrode functioning as a supporting substrate for a flexible electronic device.

7. The metal foil according to claim 1, wherein the metal foil is used as an electrode of a light-emitting element or a photoelectric element.

8. An electronic device comprising the metal foil according to claim 1 and a semiconductor functional layer having semiconductor characteristics provided on the ultra-smooth surface of the metal foil.

9. The electronic device according to claim 8, further comprising a reflective layer and/or a buffer layer provided between the metal foil and the semiconductor functional layer.

10. The electronic device according to claim 8, wherein the semiconductor functional layer has a function of excited luminescence or photoexcited power generation so that the electronic device functions as a light-emitting element or a photoelectric element.

11. The electronic device according to claim 8, further comprising a transparent or translucent counter electrode on the semiconductor functional layer.

12. The metal foil according to claim 1, wherein the metal foil is in a rolled state.

13. The metal foil according to claim 1, wherein the metal foil is drawn from a roll.

* * * * *